(12) United States Patent
Fujii et al.

(10) Patent No.: US 7,735,220 B2
(45) Date of Patent: Jun. 15, 2010

(54) METHOD OF MANUFACTURING CIRCUIT BOARD

(75) Inventors: Tatsuhisa Fujii, Kyoto (JP); Tomotaka Yonemitsu, Kyoto (JP)

(73) Assignee: Nidec Corporation, Kyoto (JP)

( * ) Notice: Subject to any disclaimer, the term of this patent is extended or adjusted under 35 U.S.C. 154(b) by 756 days.

(21) Appl. No.: 11/538,857

(22) Filed: Oct. 5, 2006

(65) Prior Publication Data

US 2007/0109729 A1    May 17, 2007

(30) Foreign Application Priority Data

Oct. 6, 2005   (JP) ............... 2005-293662

(51) Int. Cl.
*H01K 3/10*   (2006.01)
*H04R 17/00*  (2006.01)

(52) U.S. Cl. .................. 29/832; 29/25.35; 29/411; 29/412; 29/830; 29/831

(58) Field of Classification Search .............. 29/25, 29/35, 411, 412, 830, 831, 832
See application file for complete search history.

(56) References Cited

U.S. PATENT DOCUMENTS 7,266,869 B2 * 9/2007 Hatanaka et al. ........... 29/25.35

FOREIGN PATENT DOCUMENTS

| CN | 2544457 Y | 4/2003 |
|----|-----------|--------|
| JP | 2004-120980 | 4/2004 |

OTHER PUBLICATIONS

Official communication issued in counterpart Chinese Application No. 200610141693.1, issued on Jan. 4, 2008.

* cited by examiner

*Primary Examiner*—C. J Arbes
(74) *Attorney, Agent, or Firm*—Keating & Bennett, LLP

(57) ABSTRACT

A circuit board for a brushless DC motor whose rotation is controlled based on data stored on a rewritable non-volatile memory of a micro-computer mounted on the circuit board includes a substrate defined by a plurality of a circuit areas and a non-circuit area. The circuit areas and the non-circuit area are connected by a plurality of conductive patterns. The micro-computer having the rewritable non-volatile memory is mounted on each of the circuit areas. The rewritable non-volatile memory is connected to writing terminals arranged on the non-circuit area by the conductive patterns. By connecting a program writer to the writing terminals and activating the program writer, data are written to the rewritable non-volatile memory of each of the circuit areas. After writing data, the circuit areas are detached from the substrate, and a plurality of circuit boards are manufactured.

16 Claims, 8 Drawing Sheets

METHOD OF MANUFACTURING CIRCUIT BOARD

BACKGROUND OF THE INVENTION

1. Field of the Invention

The present invention generally relates to a circuit board and a brushless DC motor using the circuit board, and more particularly, the present invention relates to a circuit board used by a brushless DC motor which includes a rotation control portion for controlling the rotation of the motor based on the data stored in a memory, and the brushless DC motor using the circuit board.

2. Description of the Related Art

Brushless DC motors are used for various applications such as office electronics, home electronics, and car electronics. In some applications, the rotation of such brushless DC motors needs to be controlled with great accuracy.

The rotation control portion of the brushless DC motor may be equipped with an IC having an integrated micro-computer. Generally, the micro-computers have embedded memories, and the micro-computer used for the rotation control portion includes a control program which regulates the driving current supplied to a stator based on a rotational state of the motor, temperature, and external signals. The rotation control of the motor including such a rotation control portion is usually more sophisticated compared to motors without such control portions.

Conventionally, a read only non-volatile memory (ROM) is used for the embedded memory of the micro-computer. The control program such as a feedback control program is written to the ROM of the micro-computer, and then the micro-computer is mounted on a circuit board. The circuit board is installed onto the brushless DC motor.

The rotational setting of such a brushless DC motor can be variously modified by modifying the control program written to the ROM. Even in the case that the required specification of the brushless DC motor is changed after the circuit board is already assembled, the rotational setting of the product may be modified by changing the data stored thereon. Therefore, it may not be necessary to prepare a new circuit board.

Generally, two kinds of memories are used for the embedded memories of the micro-computers; a one time programmable read only memory (an OTP-ROM) and an electrically erasable programmable ROM (an EEP-ROM or a flash memory). The OTP-ROM is inexpensive compared to the EEP-ROM or the flash memory. The ICs with the OTP-ROMs are usually purchased in the state that programs or data are already installed by chip suppliers. After writing the programs or data, the chip suppliers need to print some letters and numbers on the top of the IC to identify the program written thereto. In other words, the chip suppliers firstly write the data to the ICs, secondly verify the data written to the ICs, thirdly print letters and/or numbers thereon, and then ship the ICs to their customers. A batch of these processes should be separately performed for every program written to the ICs. Therefore, manufacturing of various kinds of the ICs with OTP-ROM, having different programs thereon, may take more time and the manufacturing cost for such ICs may be increased. In fact, the labeled price of the programmed ICs is about 20% to 50% higher, depending on the volume of the order, than that of a blank IC.

Therefore, in the case that various kinds of ICs are manufactured for circuit boards in small amounts, of which each includes a different control program, the manufacturing cost of the circuit boards is increased and the lead time thereof becomes longer.

In addition, the control program may not be quickly replaced in order to adapt the design and/or the rotational configuration changes of the motor. In order to replace the control program, first, a new control program is provided to the chip suppliers. Second, the chip supplier detaches the ICs with an old control program from a reel and rewrites the new program to the ICs. Third, new reference numbers and/or letters are printed on the IC. Therefore, the control program installed to the IC may not be quickly replaced. Moreover, the circuit board having the IC with the old control program is discarded or stored until it is reused, which creates an extra cost of manufacturing the circuit board.

The above problems may be overcome by purchasing blank ICs from the chip supplier and writing the control program to the IC with a ROM writer, for example. Generally, electric components including ICs are shipped in a Tape and Reel package, in which a plurality of electric components are taped in line in an equally spaced manner and are mounted on a reel. The Tape and Reel package is suitable for an automatic electric component mounting system. However, the control program needs to be written to the IC before the IC is mounted on the circuit board, and each IC needs to be detached from the Tape and Reel package to write the control program by using an ordinary ROM writer. Therefore, the automatic electric component mounting system cannot be used. Then, each IC is mounted to the circuit board by hand, which decreases the efficiency of the manufacturing process.

SUMMARY OF THE INVENTION

In order to overcome the problems described above, preferred embodiments of the present invention provide a method of manufacturing a circuit board on which a micro-computer having an embedded rewritable non-volatile memory is mounted.

According to a preferred embodiment of the present invention, a substrate defined by a circuit area including the rewritable non-volatile memory and a non-circuit area including a writing terminal, and a conductive pattern connecting the rewritable non-volatile memory and the writing terminal is provided. Data are written to the rewritable non-volatile memory by connecting a program writer to the writing terminals. Then, a border between the circuit area and the non-circuit area is cut and the circuit area is obtained as the circuit board. Therefore, the circuit board manufactured by this method includes the conductive pattern which is cut at an outer edge of the circuit board.

According to another preferred embodiment of the present invention, the substrate includes a plurality of circuit areas and the non-circuit area, and the non-circuit area includes writing terminals connected to the circuit areas. By connecting and activating the program writer to the writing terminals, the data are written to the rewritable non-volatile memory mounted on each of the circuit areas. Then, borders between the circuit areas and the non-circuit area are cut and the plurality of circuit areas are obtained as the circuit boards.

According to another preferred embodiment of the present invention, a group of writing terminals is connected to the plurality of circuit areas. By virtue of the configuration mentioned above, the data are written to the rewritable non-volatile memories mounted on the circuit areas at one time, which makes manufacturing of the circuit board more efficient. As a result, lead time of the circuit board is shortened and the manufacturing cost is reduced.

According to another preferred embodiment of the present invention, whether the data are properly written to the rewritable non-volatile memory or not is verified. Then the result of the verification is marked on the circuit area. By virtue of the configuration mentioned above, reliability of the circuit board is improved.

According to another preferred embodiment of the present invention, a brushless DC motor using the circuit board is provided. The rotation of the brushless DC motor according to a preferred embodiment of the present invention is controlled in a more sophisticated manner. In addition, the manufacturing cost of the brushless DC motor according to the preferred embodiments of the present invention is reduced, and the lead time of thereof is improved as well.

Other features, elements, steps, processes, characteristics and advantages of the present invention will become more apparent from the following detailed description of preferred embodiments of the present invention with reference to the attached drawings.

DETAILED DESCRIPTION OF PREFERRED EMBODIMENTS

Referring to FIGS. 1 to 8B, preferred embodiments of the present invention will be described in detail, in which a brushless DC motor is used as a motor of an axial fan for cooling a computer. In the following description, an axial direction indicates a longitudinal direction of a rotation axis, and a radial direction indicates a direction perpendicular to the center axis of the rotation of the brushless DC motor.

First Preferred Embodiment

Figure 1:
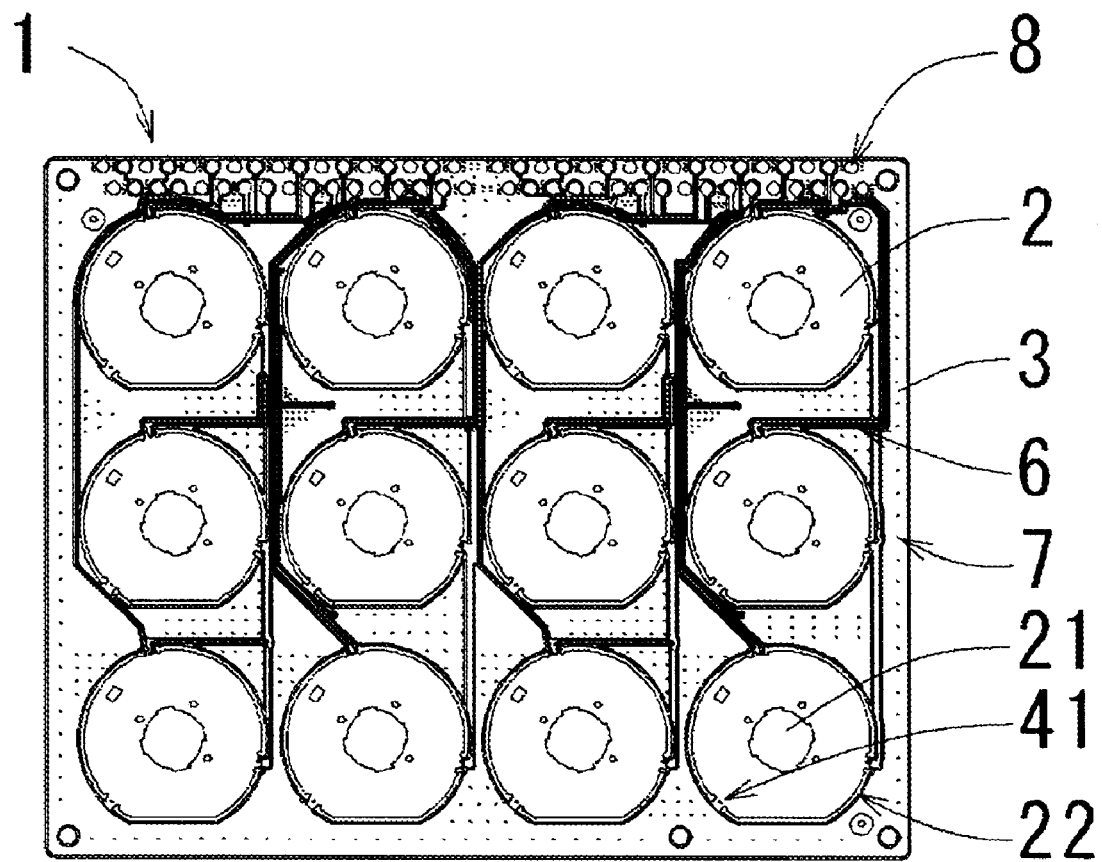
FIG. 1 is a plan view of a substrate according to a first preferred embodiment of the present invention.
Figure 2:
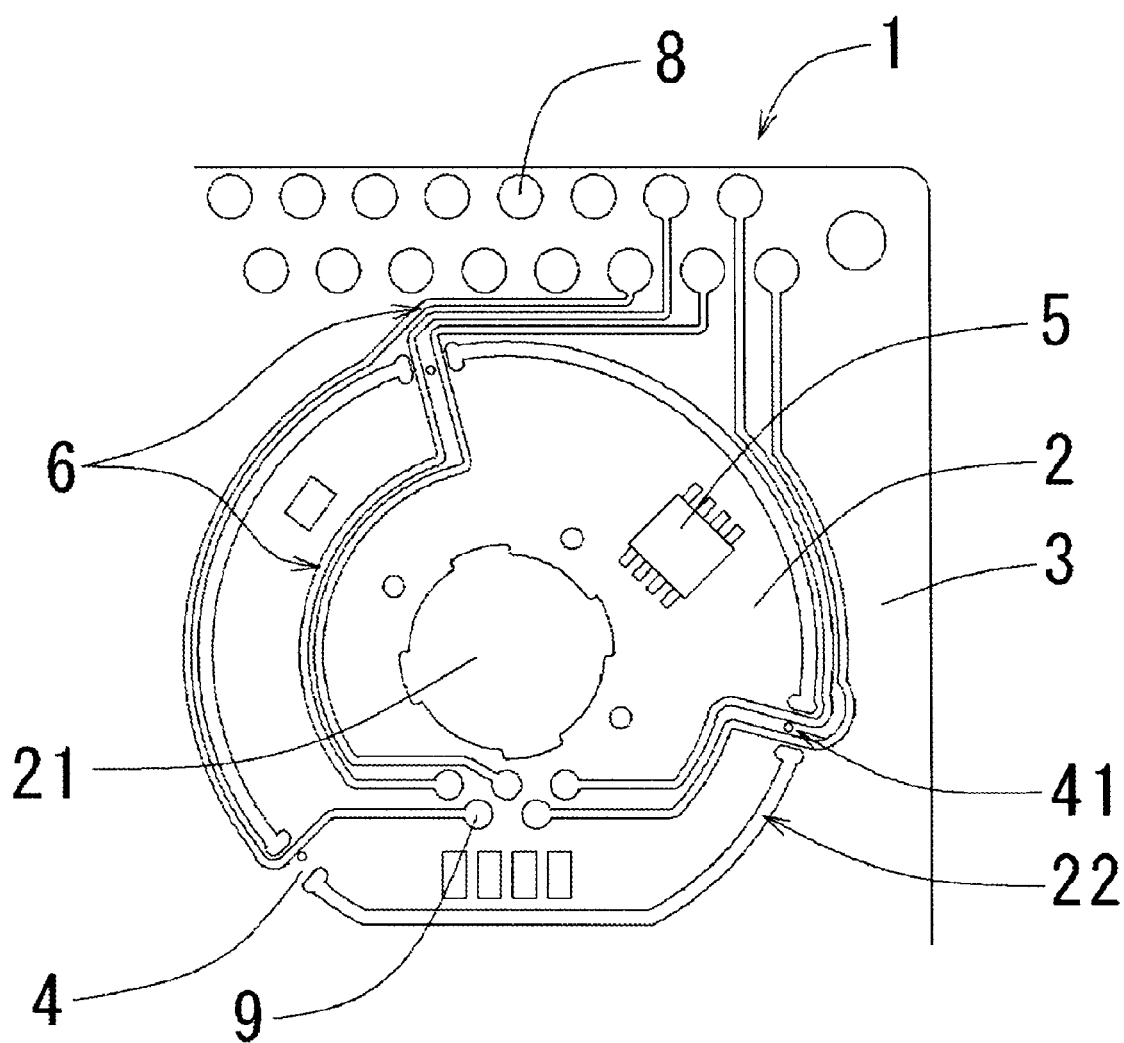
FIG. 2 is a magnified view of a principal portion of the substrate shown in FIG. 1.

FIG. 1 is a plan view of a substrate including circuit areas and a non-circuit area. FIG. 2 is a magnified view of the FIG. 1 and shows a circuit area connected to a writing terminal through circuit patterns.

Figure 3A:
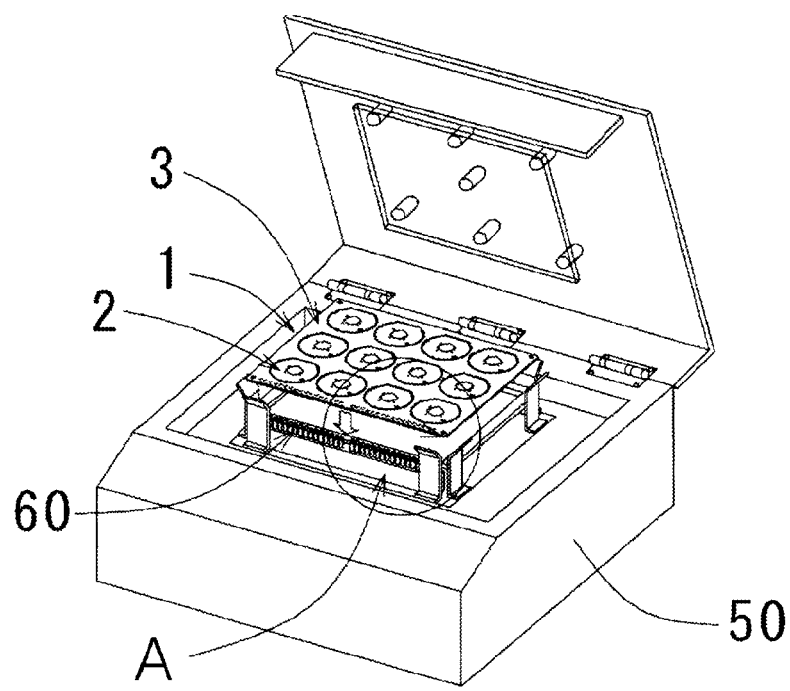
FIG. 3A is a perspective view of a program writer according to the first preferred embodiment of the present invention.
Figure 3B:
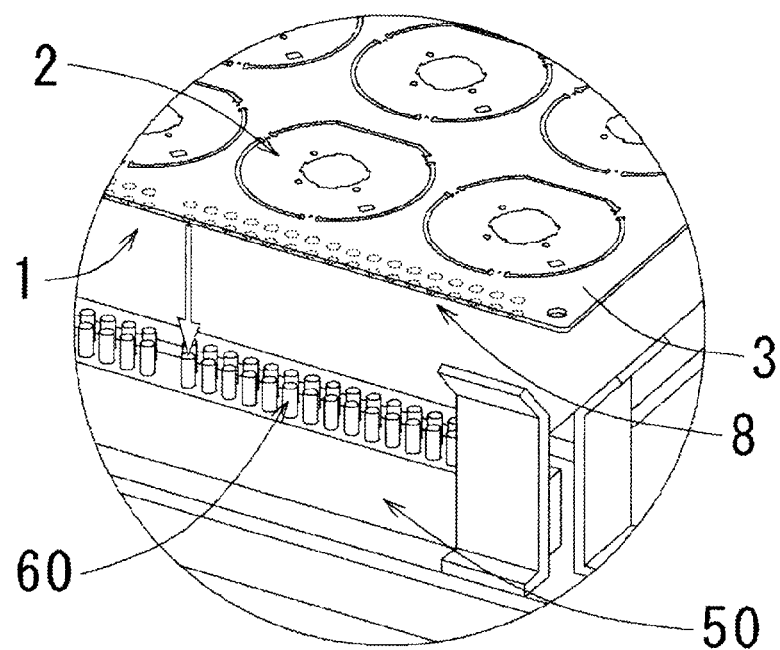
FIG. 3B is a magnified view of a principal portion of the program writer shown in FIG. 3A.
Figure 4A:
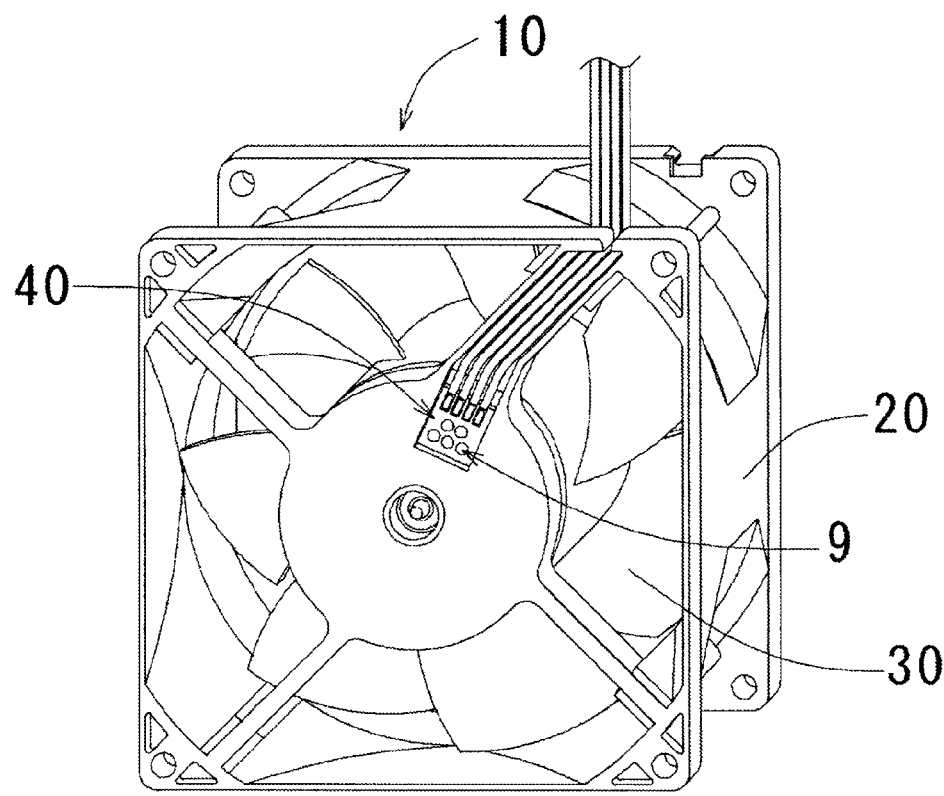
FIG. 4A is a perspective view of a fan according to the first preferred embodiment of the present invention.
Figure 4B:
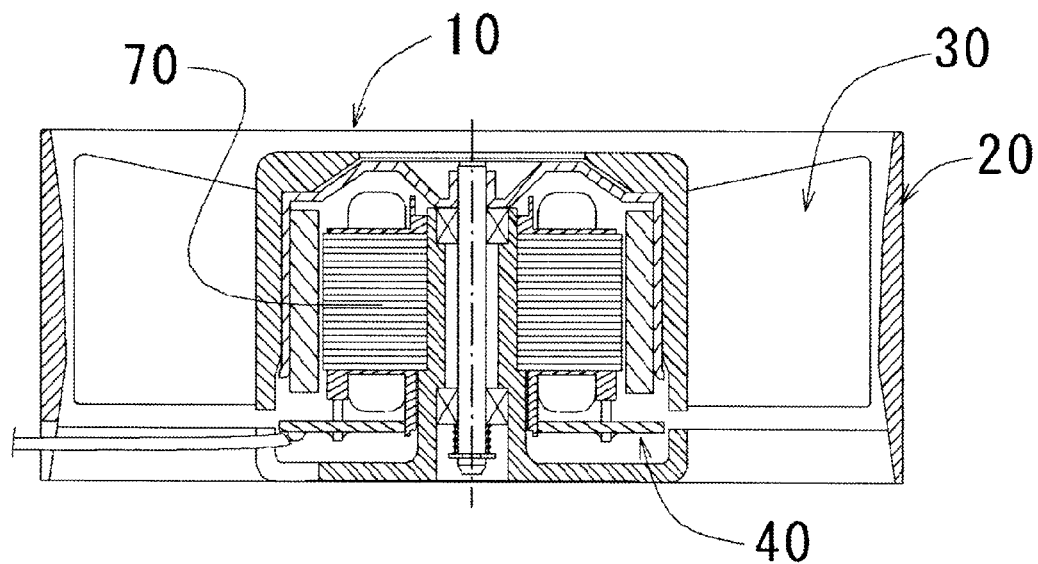
FIG. 4B is a cross sectional view of a fan according to the first preferred embodiment of the present invention.
Figure 5:
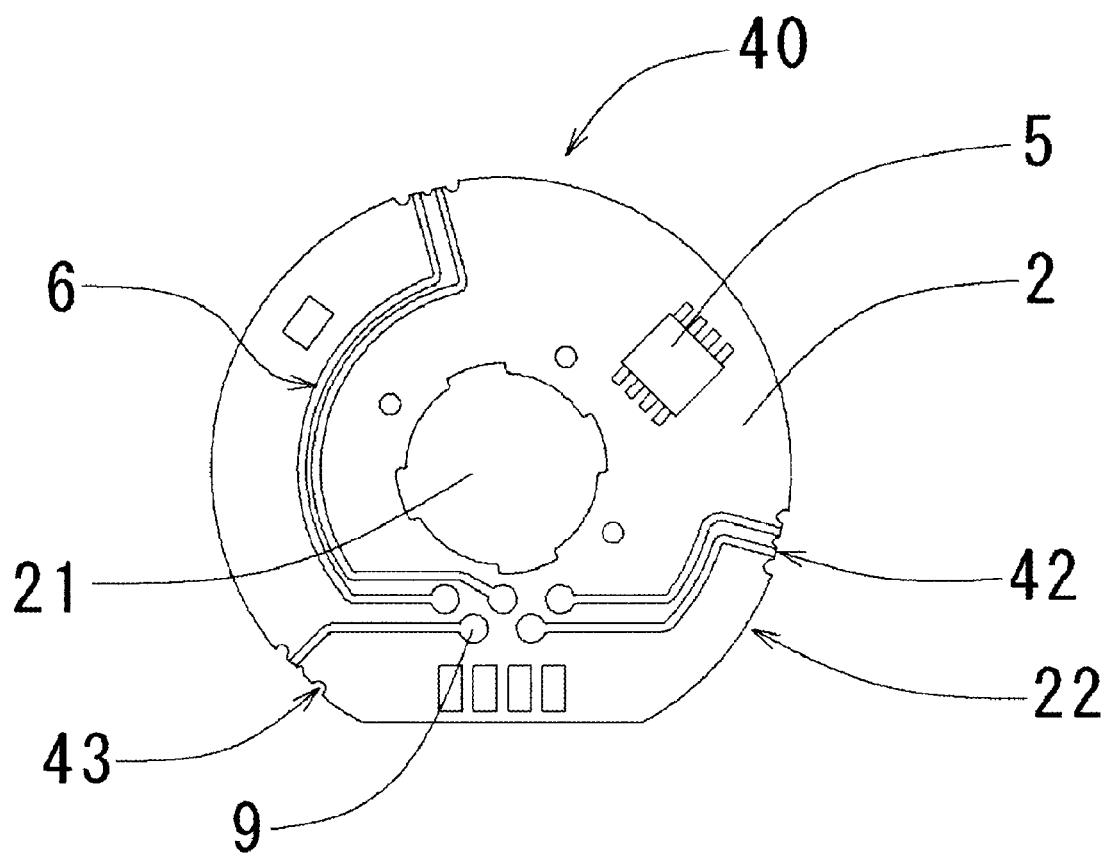
FIG. 5 is a plan view of a circuit board according to the first preferred embodiment of the present invention.

FIGS. 3A and 3B are perspective views of a program writer 50 for the substrate. FIG. 4A is a perspective view of an axial fan having a circuit board, wherein the axial fan is in a state that a name plate of the axial fan is removed. FIG. 4B is a cross sectional view of the axial fan shown in FIG. 4A. FIG. 5 is a plan view of the circuit board.

The substrate 1 shown in FIG. 1 is made of an insulating material, such as paper phenolic resin or glass epoxy resin. On the insulating material, conductive patterns 6 are printed and then an insulating layer is provided thereon. The substrate 1 is defined by a plurality of circuit areas 2 and a non-circuit area 3 as shown in FIG. 1. Each of circuit areas 2 preferably has an annular shape having a circular through hole 21 at the middle portion thereof. Three arcuate through holes 22 are arranged along each circuit area 2 in a disconnected manner such that the three arcuate through holes 22 are not connected to each other. Each of the circuit areas 2 is connected to the non-circuit area 3 by connecting portions 4 arranged between the arcuate through holes 22. However, the number of the connecting portions 4 may be other than three. Two or four, or any other suitable number, connecting portions 4 may be provided to connect each circuit area 2 to the non-circuit area 3. A perforation 41 for cutting the connecting portion 4 is provided on each of connecting portions 4. The perforation 41 is arranged at substantially the circumferentially middle of each connecting portion 4 and substantially radially inward from an outer periphery of the circuit area 2. In the first preferred embodiment of the present invention, twelve circuit areas 2 in a three-by-four matrix are arranged on the substrate 1.

The predetermined conductive patterns 6 and the insulating layer may be provided on either one side or both sides of each circuit area 2 of the substrate 1. Then, electric components including an IC 5 are automatically mounted thereon by using an automatic chip mounter. The IC 5 is used for a highly accurate feed back control or pulse width modulation of the brushless DC motor.

Each IC 5 mounted to each circuit area 2 includes a flash memory as a non-volatile memory to store the control program. The flash memory is electrically rewritable, whereby the control program of the IC 5 can be modified. The non-volatile memory is not limited to the flash memory. Any suitable non-volatile memory can be used as a preferred embodiment of the present invention as long as it is electrically rewritable.

In the first preferred embodiment of the present invention, the IC 5 mounted to each circuit area 2 is connected to the conductive patterns 6 for writing the control program thereto. As shown in FIG. 2, the conductive patterns 6 extending from the circuit area 2 pass through the connecting portion 4 and lead to writing terminals 8 arranged in two rows along an outer periphery of the non-circuit area 3. Each circuit area 2 also includes a terminal port 9. Each of the conductive patterns 6 extending from the IC 5 is first led to the terminal port 9 and then is led to the non-circuit area 3 (the pattern between the IC 5 and the terminal port 9 is not shown in FIG. 2).

The conductive patterns 6 and the insulating layer may be provided on both sides of the circuit areas 2 and the non-circuit area 3. In this case, conductive patterns 6 provided on both sides of the substrate are connected by a through hole 7. A through hole 7 is arranged on the conductive pattern 6, and the through hole 7 includes a conductive layer therein to electrically connect the conductive patterns 6 (i.e., the circuit) arranged on both sides of the substrate. For example, the conductive pattern 6 electrically connected to the IC 5 may be led to the back side of the substrate via the through hole 7 arranged in the circuit area 2. The conductive pattern 6 may pass through the back side of the connecting portion 4 and may be led to the non-circuit area 3. Then, the conductive pattern 6 may be led to the top side of the substrate via a through hole 7 arranged in the non-circuit area 3, and the conductive pattern 6 may be led to the writing terminal 8. By virtue of this configuration, a sophisticated circuit pattern may be provided compared with a circuit board having the circuit pattern on only one side. In addition, by using both sides of the connecting portion 4 to lead the conductive patterns 6 from the circuit area 2 to the non-circuit area 3, it is possible to make the connecting portion 4 thin. As a result, each circuit area 2 may be easily detached from the substrate 1. In addition, the circuit areas 2 and the non-circuit area 3 may be reduced in their dimension by arranging the conductive patterns on both sides of the substrate. Therefore, it is possible to use the material more effectively compared with the substrate having the conductive patterns on only one side. In the case that the conductive patterns 6 are arranged on one side, it is not necessary to provide the through hole 7 in the substrate.

After mounting the ICs 5 on circuit areas 2 of the substrate 1, a control program is written to the flash memories of the ICs 5 with the program writer 50 as shown in FIG. 3A.

As shown in FIG. 3B, the magnified view of a portion A of the FIG. 3A, the writing terminal pins of the program writer 50 are arranged in a same manner as the writing terminals 8 are arranged on the non-circuit area 3. By virtue of this configuration, the writing terminals 8 connected to the ICs 5 and the writing terminal pins of a writing terminal portion 60 are electrically connected by placing the substrate 1 on the program writer 50.

After the substrate 1 is properly set on the program writer 50, the control program is written to the memory of one of the ICs 5 by activating the program writer. The control program stored in the program writer 50 is electrically transferred to the IC 5 via the writing terminal pins and the writing terminals 8. The control program is simultaneously transferred to the IC 5 of each circuit area 2. In other words, the control program is transferred to the flash memories of a plurality of the ICs 5 at one time.

After the control program is written to the ICs 5, a verifying process, in which the control program written to the flash memories are compared with the one stored in the program writer to confirm the control program is properly transferred, is executed automatically. When the written control program does not match the one stored in the program writer 50 (i.e., in case a writing error occurs), the program writer 50 identifies the IC 5 having the erroneous control program. Then the program writer 50 shows which circuit area 2 the writing error occurs on its display.

The cause of the writing error may be a defect of the IC 5, faulty mounting of the IC 5 in which the IC 5 and the conductive pattern 6 are not connected properly because of faulty soldering, an open circuit of the conductive patterns 6, or loose contact between the writing terminal pins of the program writer 50 and the writing terminals 8 of the non-circuit area 3. When the writing error occurs, the IC 5 may be replaced or soldered again, and then the substrate 1 may be placed on the program writer 50 to write the control program again. After the control program is properly written to all of ICs 5 arranged on the circuit areas 2, each of the circuit areas 2 or the ICs 5 are marked (for example, by writing "OK" on the top or back side thereof by a felt pen) to show they are verified units which are fed to the next manufacturing step. In case that the cost for fixing the defect is higher than the material cost for the circuit board, the ICs or the circuit boards are marked to show which one is a defective unit or a verified unit. This dictates whether a defect fixing process is performed.

In a preferred embodiment of the present invention, the control program is written to the IC 5 at the beginning of the manufacturing process of a fan 10 to which the circuit board is to be installed. By writing the control program prior to the manufacturing process, the wrong ICs having programs for different products may be inserted into the manufacturing process. By writing the control program during the manufacturing process, it is possible to prevent the IC 5 for other models from being inserted into the manufacturing process of the circuit board. Therefore, this facilitates the storing of the electronic components in the facility.

The substrate 1 is placed on a pressing machine to detach the circuit areas 2 from the substrate 1. The pressing machine has a plurality of blades arranged so as to cut the connecting portions at the perforation 41. By activating the pressing machine, the connecting portions 4 are cut at the perforations 41 and each circuit board 2 is detached from the substrate 1. As a result, a circuit board 40 as shown in FIG. 5 is manufactured. When the connecting portions 4 are cut, cutting portions 42 are formed on the circuit board 40. In order to prevent the cutting portions 42 from radially protruding from the outer circumference of the circuit board 40, notch portions 43 are provided circumferentially on both sides of each of the cutting portions 42. At the cutting portions 42, the conductive patterns 6 are cut and cutting faces thereof are exposed to the outside. By this connection, the circuit board manufactured according to the present preferred embodiment of the present invention is easily distinguished. Each of the circuit areas 2 includes the terminal port 9 electrically connected to the IC 5. Therefore, the control program stored on the IC 5 may be modified after each circuit area 2 is detached from the substrate 1.

Each circuit area 2 detached from the substrate 1, i.e., the circuit board 40, is then fed to the manufacturing process of the fan. Through this manufacturing process, the micro-computer controlled fan 10 having the circuit board 40 is manufactured. In FIGS. 4A and 4B, the reference number 20 designates a casing and the reference number 30 designates an impeller. The circuit board 40 is electrically connected to a stator coil portion 70 and then is installed to the fan 10.

As shown in FIG. 4A, the casing of the fan 10 may include an opening so that the terminal port 9 is exposed to the outside of the fan 10. By virtue of this configuration, the control program written to the IC 5 may be modified even after the circuit board 40 is installed to the fan 10.

As explained above, in the present preferred embodiment of the present invention, the ICs 5 are mounted on the circuit areas 2 of the substrate 1 before the control program is transferred to the ICs 5. By virtue of this configuration, the control program may be written to a plurality of ICs 5 mounted on the circuit areas 2 at one time. In addition, by virtue of this configuration, unlike the related art, the writing process in which the control program is written to the ICs 5 does not affect the efficiency of the automatic mounting process of the ICs 5.

Moreover, by detaching each of circuit areas 2 from the substrate 1, a plurality of circuit boards 40 are manufactured with only one writing procedure, which improves the time efficiency of the manufacturing process.

Moreover, since the ICs 5 have electrically erasable non-volatile memories to which data are electrically writable, it is not necessary to purchase ICs 5 to which the control program is already written. In case that the various kinds of fans 10 with different control programs are produced in small batches, a necessary amount of the ICs 5 are mounted to the circuit areas 2, and then the control program is written to the ICs with the program writer 50. By virtue of this configuration, it is possible to use the substrate 1 more effectively, without discarding excess circuit boards 40. In addition, the lead time of the fan 10 is improved.

In addition, since the flash memory is rewritable, it is possible to adapt the rotational configuration change or design change after the control program is written to the ICs 5 by modifying or rewriting the control program stored on the ICs 5. Therefore, production of the circuit board 40 becomes even more efficient. Conventionally, when the design or the rotation configuration of a fan is changed, new ICs are ordered and the manufacturing of the fan is started all over again after getting the new ICs. The circuit boards with the old ICs are discarded or stored until they are reused. In the present preferred embodiment of the present invention, however, the circuit boards and electronic components are efficiently used for manufacturing of the fan 10.

In addition, each of the circuit boards 40 includes the terminal port 9 arranged on each of the circuit areas 2. Therefore, the control program stored on the IC 5 may be modified after the manufacturing of the circuit board 40 is completed.

Next, modified examples of the first preferred embodiment of the present invention will be described. The writing terminals 8 may be defined by a plurality of through holes including conductive layers therein. In this case, the control program is written to the ICs 5 mounted on the circuit areas 2 by inserting the writing terminal pins of the program writer 50 into the through holes. In this preferred embodiment of the present invention, a plurality of substrates 1 may be arranged on the program writer 50 so that the writing terminal pins are inserted and contact all of the writing terminals 8 of substrates 1 (described in more detail below with respect to FIG. 8B). By virtue of this configuration, the control program is written to the ICs 5 mounted on the plurality of substrates 1, which makes the manufacturing of the circuit board 40 more efficient.

After the control program is written to the ICs 5, the verifying process is automatically executed. In this preferred embodiment of the present invention, the verifying process is executed for each writing pin. Therefore, the substrate 1 on which a writing error occurs is not identifiable because a plurality of substrates 1 are electrically connected to a single writing pin. In order to identify the substrate 1 on which the writing error occurs, an additional terminal is provided to allocate an address specific to each of substrates 1, and an address reading pin may be provided to electrically connect the additional terminal with the program writer 50. By virtue of this configuration, the substrate 1 on which the writing error occurs is identifiable.

Second Preferred Embodiment

Figure 6:
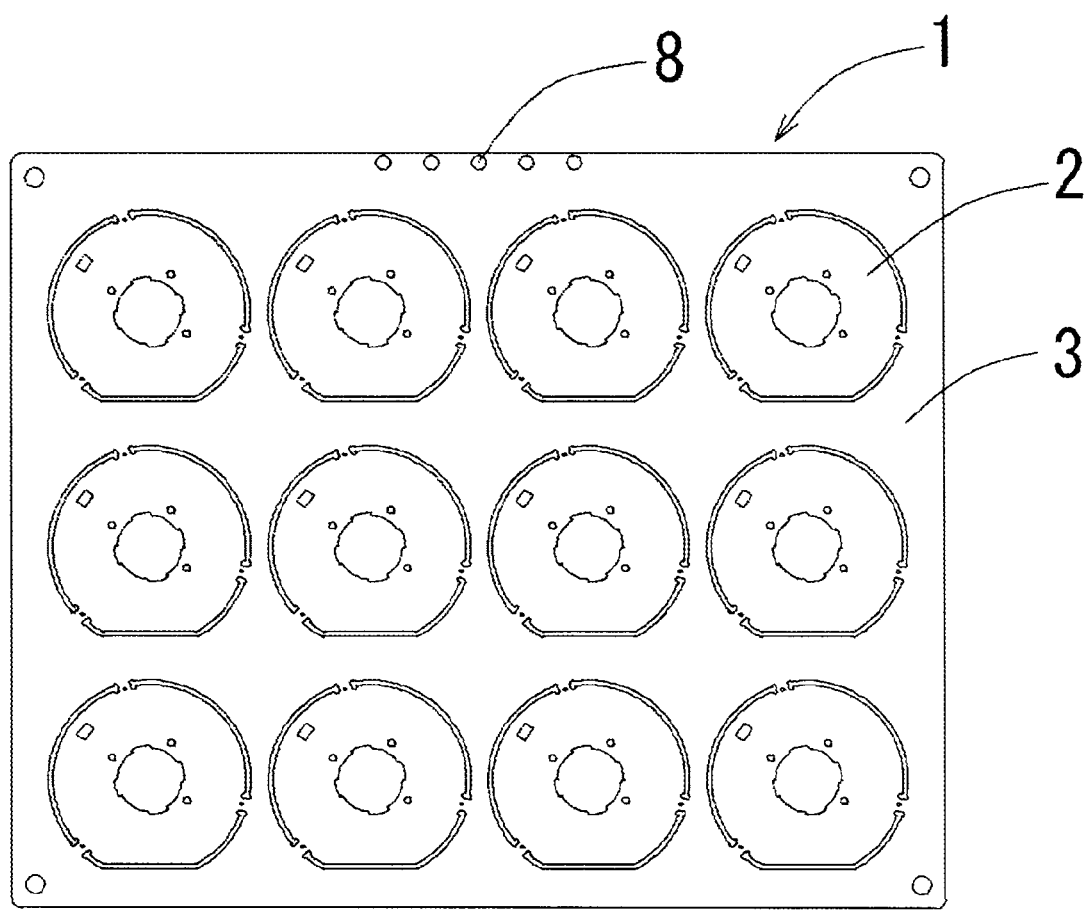
FIG. 6 is a plan view of the substrate according to a second preferred embodiment of the present invention.

Referring to FIG. 6, a plan view of a substrate 1 including circuit areas 2 and a non circuit area 3, the second preferred embodiment of the present invention will be described in detail. In the second preferred embodiment of the present invention, configuration of the writing terminals arranged on the non-circuit area will be described in detail. In FIG. 6, the configuration other than that of the writing terminals is similar to that explained in the first preferred embodiment (see FIG. 1) and is labeled with the same reference numerals in the explanation that follows.

In this preferred embodiment of the present invention, the conductive patterns 6 are electrically connected to each of the ICs 5 mounted to each of circuit areas 2 so that the control program is written thereto. The conductive patterns 6 extending from each of the circuit areas 2 pass through the connecting portions 4 and are led to writing terminals 8 arranged in line along an outer periphery of the non-circuit area 3. For example, five writing terminals 8 are required to write the control program to a single IC 5. In this preferred embodiment of the present invention, a plurality of conductive patterns 6 extending from the same kinds of pins of ICs 5 mounted to different circuit areas 2 are joined together and the joined conductive pattern is led to the single writing terminal 8. Therefore, only five writing terminals 8 are arranged on the non-circuit area 3 to write the control program to twelve ICs 5.

After the substrate 1 is properly placed in the program writer 50, the control program is written to the memories of the ICs by activating the program writer. The control program stored on the program writer 50 is electrically transferred to the memories of the ICs 5 via the writing terminal pins and the writing terminals 8. The control program is simultaneously transferred to each of the ICs 5 mounted on each of circuit areas 2. In other words, the control program is transferred to a plurality of ICs 5 at one time.

Then, the verifying process is automatically executed for each circuit area 2. In the first preferred embodiment of the present invention, when a written control program does not match the one stored in the program writer 50 (i.e., in the case in which a writing error occurs, the program writer 50 identifies the IC 5 having the erroneous control program), the program writer displays which circuit area 2 includes the IC 5 having the erroneous control program on its display. In the first preferred embodiment of the present invention, the writing terminals 8 for each of the ICs 5 are arranged on the non-circuit area 3. Therefore, the verifying process is executed for each of the ICs 5. In the second preferred embodiment of the present invention, however, portions of the conductive patterns 6 from each of the ICs 5 are joined together and are led to five writing terminals 8. Therefore, the verifying process of each of the ICs 5 is executed at one time. Therefore, in the second preferred embodiment of the present invention, the verifying process may be completed in a relatively short time. In this preferred embodiment of the present invention, the one of the ICs 5 on which the writing error occurs is not identifiable because a plurality of ICs 5 are electrically connected to a single writing terminal 8. In case that the occurrence of the writing error is rare, or that the control program is written to a large amount of the ICs 5, which requires a lot of time, this preferred embodiment of the present invention may be preferably applied. In addition, the conductive patterns 6 are led to a small number of the writing terminals 8. Therefore, the arrangement of the writing terminal pins of the program writer 50 is simplified, which results in reducing the production costs.

Third Preferred Embodiment

Figure 7:
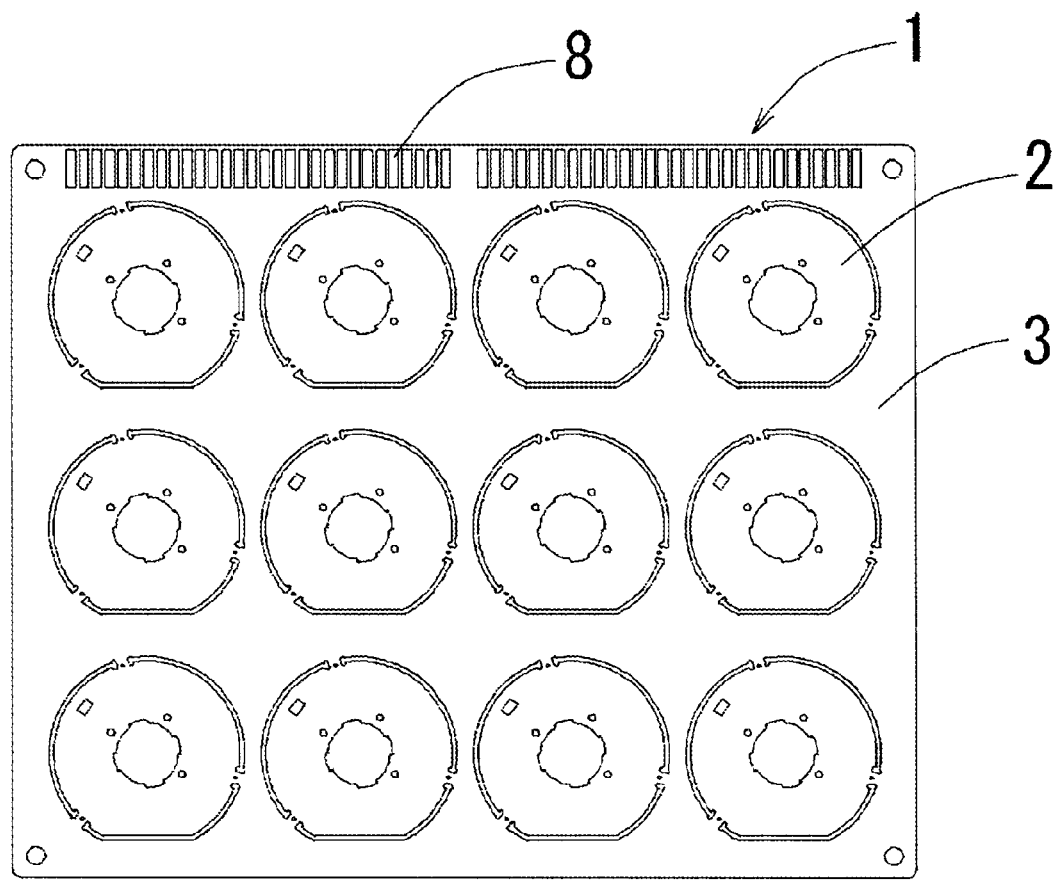
FIG. 7 is a plan view of a substrate according to a third preferred embodiment of the present invention.

Referring to FIG. 7, a plan view of a substrate including circuit areas 2 and a non circuit area 3, and to FIG. 8, a perspective view in which the substrate 1 is placed on the program writer 50, the third preferred embodiment of the present invention will be described in detail. In the third preferred embodiment of the present invention, an arrangement of the program writer 50 and the substrate 1 is described in detail. In FIG. 7, similar configurations explained in the first preferred embodiment (see FIG. 1) are labeled with the same reference numerals in the explanation that follows.

In the third preferred embodiment of the present invention, the conductive patterns 6 extend from each of the ICs 5 mounted to each circuit area 2 so as to write the control program to the ICs 5. The conductive patterns 6 extending from each of the circuit areas 2 pass through the connecting portions 4 and are led to writing terminals 8 arranged in a row along the outer periphery of the non-circuit area 3. Each of the writing terminals 8 preferably has a substantially square shape whose longitudinal side is substantially perpendicular to the outer periphery of the non-circuit area 3, and the plurality of the writing terminals 8 are arranged in a substantially equally spaced manner on the outer periphery of the non-circuit area 3.

Figure 8A:
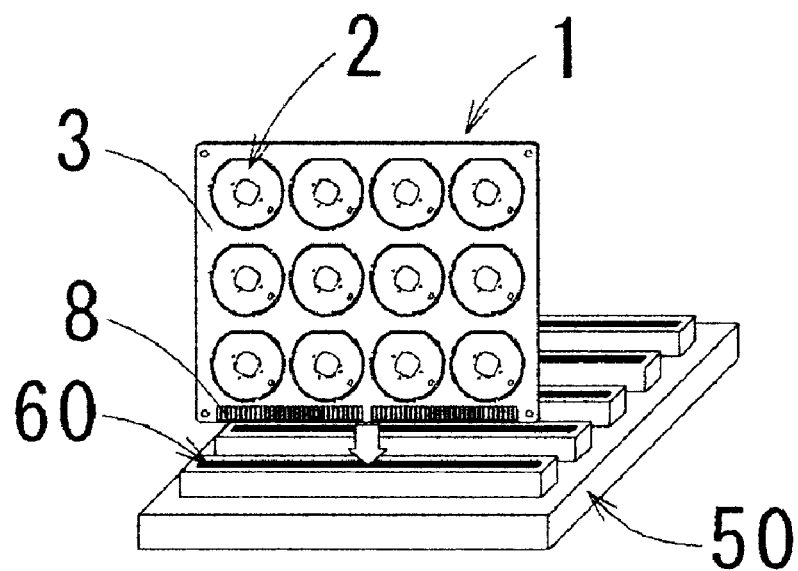
FIGS. 8A and 8B are perspective views according to the third preferred embodiment of the present invention in which a single substrate and a plurality of substrates, respectively, are attached to the program writer.
Figure 8B:
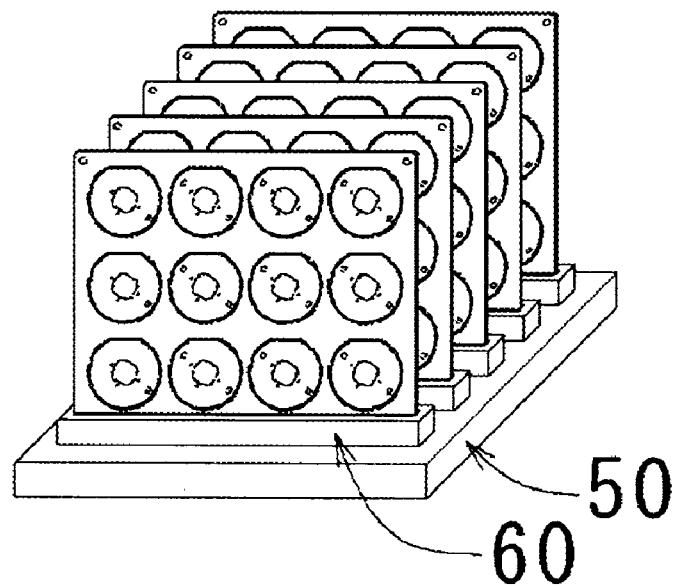

A plurality of the writing terminal portions 60 are arranged on the program writer 50 so that the control program is written to the ICs 5 of a plurality of substrates 1 at one time. As shown in FIG. 8A, a portion of the substrate 1 is inserted into the writing terminal portion 60 so that the writing terminals 8 are electrically connected to the writing pins (not shown in FIG. 8A) defining the writing terminal portions 60. As shown in FIG. 8B, a plurality of substrates 1 may be arranged on the program writer 50. Subsequently, the program writer 50 is activated to write the control program to each of the ICs 5 and verify the control program written to the ICs 5. In the third preferred embodiment of the present invention, the control program is written to the ICs 5 mounted to circuit areas 2 of the substrates 1 at one time. As a result, the circuit board 40 is efficiently manufactured. Moreover, in the third preferred embodiment of the present invention, in which the substrate 1 is supported on the program writer 50 by inserting the portion thereof into the writing terminal portion 60, the substrate 1 is easily arranged on the program writer 50. Additionally, in the third preferred embodiment of the present invention, a plurality of substrates 1 may be arranged on the program writer and the control program is written to the ICs 5 mounted on a plurality of substrates 1 at one time. However, a single substrate 1 may be inserted into the program writer one at a time and the control program may be written to the ICs 5 mounted on the single substrate 1.

In this preferred embodiment of the present invention, the writing terminals 8 are arranged on one side of the substrate 1. However, the writing terminals 8 may be arranged on both sides of the substrate 1.

In this preferred embodiment of the present invention, the writing terminals 8 are arranged on a surface along an outer peripheral edge of the substrate in an adjacent manner. However, the writing terminals 8 may be arranged in a separated manner. For example, the writing terminals 8 may be divided into a plurality of groups, and each group may be separately arranged on the substrate 1. Meanwhile, the writing terminals may be arranged on a surface other than that along the outer peripheral edge of the substrate 1.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A manufacturing method of a circuit board, the method comprising the steps of:
preparing a substrate defined by a circuit area on which electronic components including a memory are mounted, a non-circuit area which includes a writing terminal arranged to be connected with a program writer, and a conductive pattern which is arranged to electrically connect the memory and the writing terminal;
writing data to the memory by connecting the program writer to the writing terminal; and
cutting a portion of the substrate in a cutting region arranged between the circuit area and the non-circuit area to produce the circuit board; wherein
the substrate includes a through hole arranged in or along the cutting region.

2. The method as set forth in claim 1, wherein the conductive pattern is arranged to extend through the connecting portion, and the cutting step includes cutting the connecting portion.

3. A manufacturing method of a circuit board, the method comprising the steps of:
preparing a substrate defined by a plurality circuit areas each having electronic components including a memory, a non-circuit area including at least one writing terminal arranged on the non-circuit area and arranged to be connected with a program writer, and at least one conductive pattern which is arranged to electrically connect the memory and the at least one writing terminal;
writing data to the memory mounted on each of the circuit areas by connecting the program writer to the at least one writing terminal; and
cutting a portion of the substrate in a cutting region arranged between at least one of the circuit areas and the non-circuit area to produce the circuit board; wherein
the substrate includes a plurality of through holes arranged in or along the cutting region.

4. The method as set forth in claim 3, wherein the at least one conductive pattern is arranged to extend through the connecting portion, and the cutting step includes cutting the connecting portion.

5. The method as set forth in claim 4, wherein a predetermined number of writing terminals for each of the circuit areas is provided on the non-circuit area, and the writing step includes writing to the memory of each of the circuit areas with the program writer connected to at least the predetermined number of writing terminals.

6. The method as set forth in claim 5, wherein the substrate has a substantially rectangular shape and one side of the substrate includes at least a portion of the non-circuit area, and all of the predetermined number of the writing terminals are arranged only at the one side of the substrate.

7. The method as set forth in claim 5, wherein the substrate has a substantially rectangular shape and one side of the substrate includes at least a portion of the non-circuit area, the writing terminals are arranged on the one side in an equally spaced manner along an outer periphery of the substrate.

8. The method as set forth in claim 4, wherein a predetermined number of writing terminals is provided on the non-circuit area, each of the writing terminals is connected to two memories respectively arranged in different ones of the circuit areas, and the writing step includes writing the data simultaneously to two or more memories respectively arranged in different ones of the circuit areas with the program writer connected to the writing terminals.

9. The method as set forth in claim 8, wherein the substrate has a substantially rectangular shape and a surface of the substrate along an outer peripheral edge of the rectangular shape includes at least a portion of the non-circuit area, and all of the predetermined number of writing terminals are arranged only on the surface along the outer peripheral edge in an adjacent manner.

10. The method as set forth in claim 4, wherein the substrate includes a plurality of conductive patterns arranged on two opposite sides of the substrate, and at least one conductive pattern extends along a first one of the two opposite sides of the connecting portion and at least one conductive pattern extends along the other one of the two opposite sides of the connecting portion.

11. The method as set forth in claim 3, further comprising a step of verifying the data written to the memory prior to the cutting step, wherein the verifying step includes comparing the written data to the data in the program writer.

12. The method as set forth in claim 11, further comprising a step of recording a result of the verifying step on the substrate in a visible manner between the verifying step and the step of cutting the border between each of the circuit areas and the non-circuit area.

13. The method as set forth in claim 1, wherein there are a plurality of through holes arranged to surround substantially all of the circuit area except for locations of the connecting regions.

14. The method as set forth in claim 3, wherein the through holes are arranged to surround substantially all of the circuit areas except for locations of the connecting regions.

15. The method as set forth in claim 8, wherein the data simultaneously written to the memories respectively arranged in different ones of the circuit areas is identical.

16. The method as set forth in claim 3, wherein
the cutting step is performed to simultaneously separate a plurality of the circuit areas from the non-circuit area.

* * * * *